(12) United States Patent
Iaculo et al.

(10) Patent No.: US 9,189,390 B2
(45) Date of Patent: *Nov. 17, 2015

(54) WEAR LEVELING FOR ERASABLE MEMORIES

(71) Applicant: Micron Technology, Inc., Boise, ID (US)

(72) Inventors: Massimo Iaculo, San Marco Evengelista (IT); Ornella Vitale, Cicciano (IT); Antonino Pollio, Vico Equense (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/350,558

(22) Filed: Apr. 8, 2014

(65) Prior Publication Data

US 2014/0351493 A1  Nov. 27, 2014

Related U.S. Application Data

(63) Continuation of application No. 13/142,487, filed as application No. PCT/IT2008/000817 on Dec. 30, 2008, now Pat. No. 8,694,718.

(51) Int. Cl.
*G06F 12/00* (2006.01)
*G06F 12/02* (2006.01)
*G11C 16/34* (2006.01)

(52) U.S. Cl.
CPC .......... *G06F 12/0246* (2013.01); *G11C 16/349* (2013.01); *G06F 2212/7211* (2013.01)

(58) Field of Classification Search
CPC .................. G06F 12/0246; G06F 2212/7211; G11C 16/349
USPC ....................... 365/185.33; 711/103
See application file for complete search history.

(56) References Cited

U.S. PATENT DOCUMENTS

| | | | |
|---|---|---|---|
| 2003/0227804 A1* | 12/2003 | Lofgren et al. | 365/200 |
| 2005/0114589 A1 | 5/2005 | Lofgren et al. | |
| 2010/0191897 A1 | 7/2010 | Zhang et al. | |
| 2011/0085657 A1 | 4/2011 | Matthews, Jr. | |
| 2011/0238892 A1 | 9/2011 | Tsai et al. | |
| 2011/0246705 A1 | 10/2011 | Mudama et al. | |

FOREIGN PATENT DOCUMENTS

| | | |
|---|---|---|
| EP | 1 936 632 | 6/2008 |
| WO | 2004/040584 | 5/2004 |

OTHER PUBLICATIONS

International Search Report and Written Opinion for PCT Application No. PCT/IT2008/000817 dated May 25, 2009.

* cited by examiner

*Primary Examiner* — Nathan Sadler
*Assistant Examiner* — Mehdi Namazi
(74) *Attorney, Agent, or Firm* — Dorsey & Whitney LLP

(57) ABSTRACT

In accordance with some embodiments, wear leveling may be done based on the difference in age of discarded blocks and engaged blocks. Data is moved to an older discarded block from a younger engaged block. Two wear leveling bits may be used for each logical block, such that the wear leveling bits are used in alternating cycles.

23 Claims, 10 Drawing Sheets

WEAR LEVELING FOR ERASABLE MEMORIES

CROSS-REFERENCE TO RELATED APPLICATION

This application is a continuation of U.S. patent application Ser. No. 13/142,487, filed Jun. 28, 2011, U.S. Pat. No. 8,694,718 issued on Apr. 8, 2014, which claims priority to PCT Patent Application No. PCT/IT2008/000817 filed on Dec. 30, 2008. These applications and patent are incorporated herewith, in their entirety, for any purpose.

BACKGROUND

This relates generally to erasable memories, such as flash and electrically erasable read only memories (EEPROMs).

Erasable memories may have erasable elements that can become unreliable after a predetermined number of erase cycles. Thus, if one cell is erased dramatically more than other cells, that cell may be prone to earlier failure than the rest of the memory. As cells fail, the life of the memory is reduced.

Wear leveling attempts to level out the erasures across sets of cells so that the cells have the greatest useful life. Generally, the wear leveling works on the block level by preventing one block from getting erased more times than other blocks.

DETAILED DESCRIPTION

Figure 1:
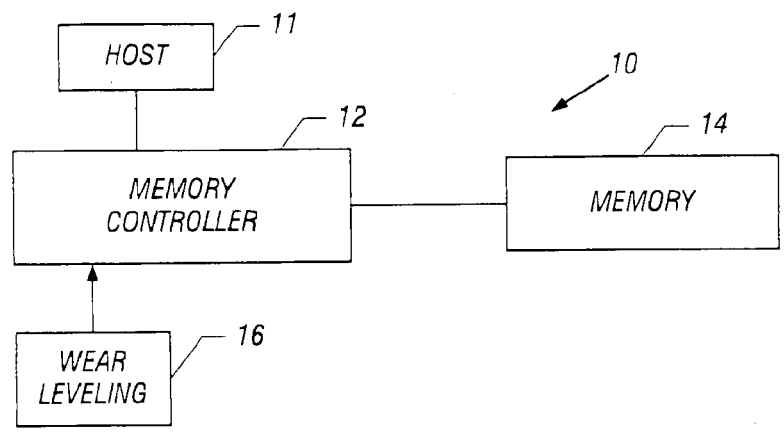
FIG. 1 is a depiction of an apparatus in accordance with one embodiment of the present invention.

Referring to FIG. 1, a memory system 10 may include a memory controller 12 coupled to a memory 14. A wear leveling algorithm 16 may be stored on a memory controller 12. It may be implemented in hardware, software, or firmware. In a software based embodiment, instructions may be stored in a storage such as a microelectronic memory. In some embodiments, that storage may be onboard the memory controller and, in other embodiments, it may be separate therefrom. A controller or processor within the memory controller 12 executes the instructions to cause a sequence of operations to occur.

Figure 2:
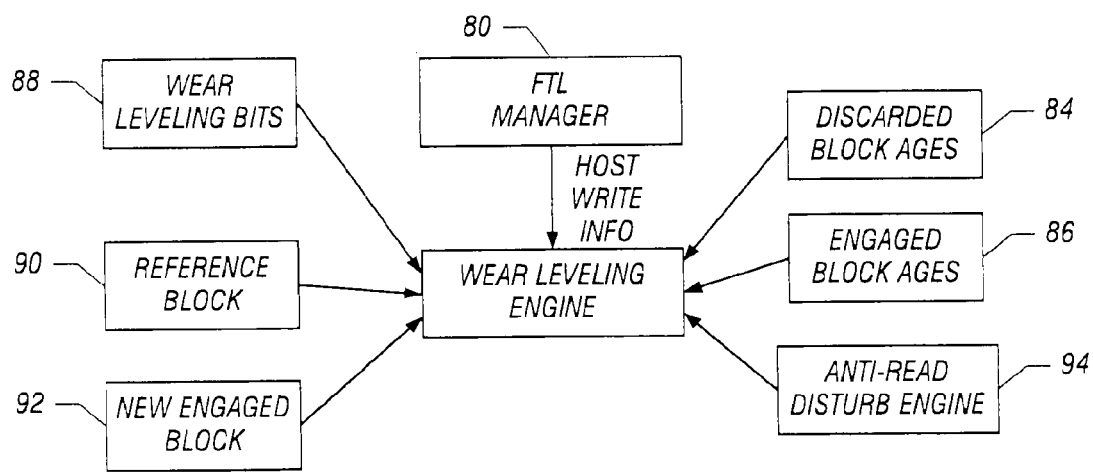
FIG. 2 shows a wear leveling system according to one embodiment.

Commonly in flash memories, a flash translation layer (FTL) manager 80, shown in FIG. 2, provides address translation and garbage collection. The flash translation layer manager 80 may include an allocator that handles translation of logical block addresses and their physical block addresses. A cleaner does garbage collection to clean pages of invalid data. Garbage collection is done on a per block basis. When a block is reclaimed, valid data in any pages of the block to be reclaimed is copied to other free pages. The flash translation layer provides an abstraction level between a host 11 (FIG. 1), such as a camera or MP3 reader, and the memory device 14 (FIG. 1) itself. The flash translation layer provides a logical address space. Each logical address may be dynamically associated to a physical block.

Figure 3:
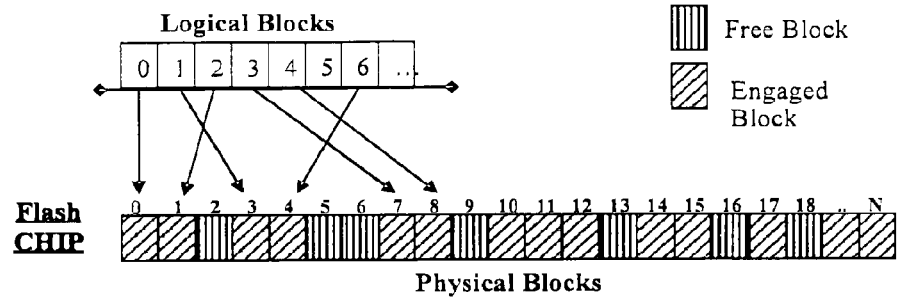
FIGS. 3-18 are depictions of the wear leveling algorithm in accordance with some embodiments.

When a new logical block is written by the host, a free physical block is associated to it. The written block then goes into the engaged state, as shown in FIG. 3. There, logical blocks 0-$n$ are mapped to physical blocks ("Flash Chip") on the flash memory chip. Thus, logical block 0 is written to physical block 0, which is then shown as being an engaged block, but no logical block is written to physical block 2, which is shown as being a free block.

Figure 4:
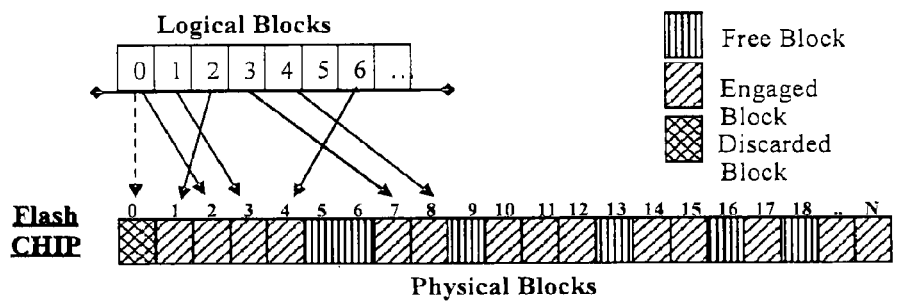

If data contained in the logical block has to be updated, a new free physical block will be engaged and the current physical block will become discarded, as shown in FIG. 4. Here physical block 2 becomes engaged and the current physical block 0 becomes discarded. This operation is called garbage collection and the related logical block is then said to be de-fragmented.

Figure 5:
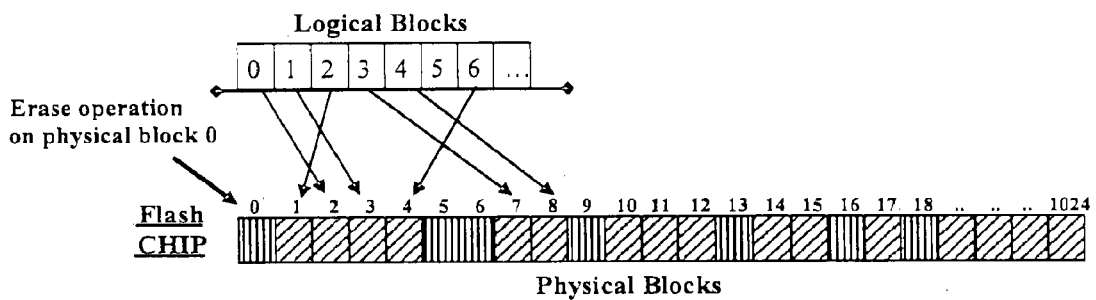

To free a discarded block, such as block 0, it must be erased, as indicated in FIG. 5 ("Erase Operation on physical block 0).

After an erase operation, the erased block will increase in age. A block wears out after a limited number of erase cycles. The number may be different for single level versus multi level cells. So, in order to increase the device life, the erase operations are spread uniformly over all the physical blocks, regardless of host behavior, through the use of a wear leveling algorithm.

To maximize the device life, the wear leveling algorithm may be both static and dynamic in some embodiments. In accordance with some embodiments, wear leveling cycles are useful to observe the host behavior and to adapt the wear leveling operations to that host behavior. The wear leveling algorithm may be implemented by a wear, leveling engine 82, shown in FIG. 2, that keeps down the difference between the maximum age of the discarded blocks and the minimum age of the engaged blocks. In a garbage collection operation, reading the age of the just discarded block (block 84), it finds an old discarded block and a young engaged block (block 86), using a wear leveling bit described below, to perform wear leveling operations. Yet it may avoid unnecessary pejorative wear leveling operations in some embodiments.

During a wear leveling cycle, information about garbage collection, in which a logical block is involved, is stored using two bits called wear leveling bits in a storage 88. One bit is used in even cycles and the other bit is used during odd cycles. During a wear leveling cycle, all wear leveling bits change as a result of a host writing or wear level de-fragmentation. When all wear leveling bits have the same value, a new cycle starts. So, in each cycle, the wear leveling operations involve the engaged blocks whose wear leveling bit was not changed.

A wear leveling action is performed when the difference between the ages of a discarded block and an engaged block, whose wear leveling bit has not yet changed in the current cycle, called a reference block, goes over a threshold value. The reference block storage 90 keeps track of the reference block. The wear leveling operation copies static data from the young reference block to the old discarded block. In effect then, data is moved from a block whose data is not updated frequently (a rarely erased physical block) to a block that previously held data that was updated frequently (a frequently erased physical block).

The reference block is selected using wear leveling bits. The reference block is chosen from all the available blocks in fixed cycles having the wear leveling bit unchanged. When a logical block is de-fragmented, the first wear leveling bit will be changed if it has not yet been changed and the age of the just discarded block is compared with the age of the reference block. If the age difference goes over a threshold, the wear leveling operation is performed. In other words, the reference block will be de-fragmented and the related wear leveling bit will be changed.

When a logical block is de-fragmented, the age of the new physical block that hosts the logical block, called the new engaged block (block 92), is compared with the maximum age or the average age, of all the blocks. If this new engaged block is young, the second wear leveling bit is changed, so that the logical block will not be involved in the wear leveling operations of the next cycle. That is, this logical block will not be selected as a reference block in the next cycle because it has its wear leveling bit changed. This comparison is useful in avoiding unnecessary wear leveling operations on blocks involved in host operations.

When static data blocks (written only once) are less than the number of free and dynamic blocks (all remaining blocks in the device), at the end of the wear leveling cycle, some old blocks will not have been mapped under rarely used logical addresses. Therefore, when a new wear leveling cycle starts, there will be an age difference over the threshold between engaged de-fragmented blocks (blocks with bit unchanged) and discarded blocks. In this condition, without using the logical bit, a lot of wear leveling operations might be performed on a block that will be de-fragmented as a result of host operations.

Figure 6:
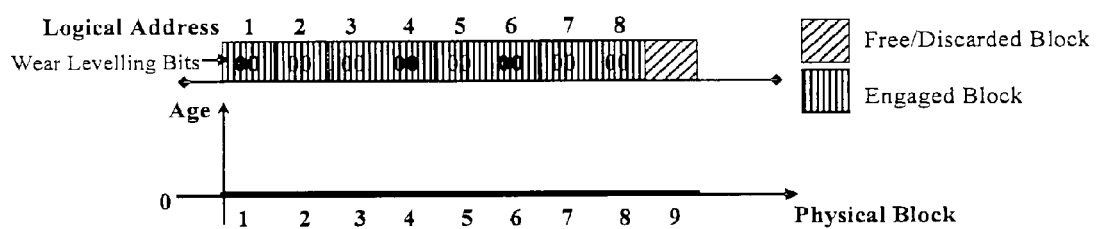

Referring to FIG. 6, logical blocks 1-3 contain static data or data written only once by the host. Logical blocks 4-8 contain dynamic data or data often updated by the host. So the physical blocks, which have the logical addresses 1-3, are not erased, while the other physical blocks are uniformly erased. In this example, we suppose that the host rewrites addresses 4-8 uniformly.

Figure 7:
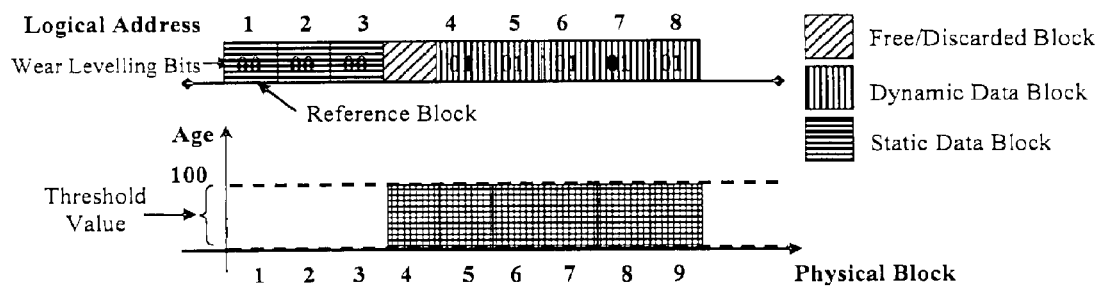

As the logical blocks 4-8 are updated by the host, they have their first wear bit changed. The reference block is the block with the first wear leveling bit not changed, for example, the logical block 1, as shown in FIG. 7.

When the age difference between the free or dynamic data blocks or the static data blocks becomes higher than the threshold value (100 in this example), a wear leveling operation is performed to associate the oldest physical block to the static data logical addresses (1 to 3). When the first wear leveling bit of all the logical blocks has been changed from 0 to 1, the first wear leveling cycle ends.

The static data size is less than half of the device size in this example. So only a part of the old physical blocks can be associated to static addresses. In this example, at the end of the cycle, three of the eight old blocks are associated to static data addresses, and the other five blocks are associated to dynamic data again. In this situation, the second wear leveling bit is useful in avoiding unneeded wear leveling operations.

Figure 8:
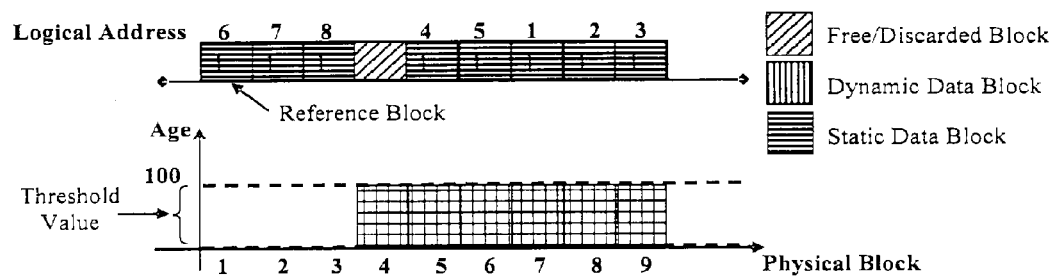

In fact, if the second wear leveling bit is not used, as indicated in FIG. 8, at the beginning of a new wear leveling cycle, all the wear leveling bits are equal, so there is no information about static and dynamic addresses. In this transition phase, a dynamic data block could be used as a reference. For example, if logical block 6 were selected as the reference block, an update of data contained in logical block 4 (or 5) would trigger a wear leveling operation. But this is an unneeded wear leveling operation because logical block 6 is a dynamic data block and it will be updated by the host.

Figure 9:
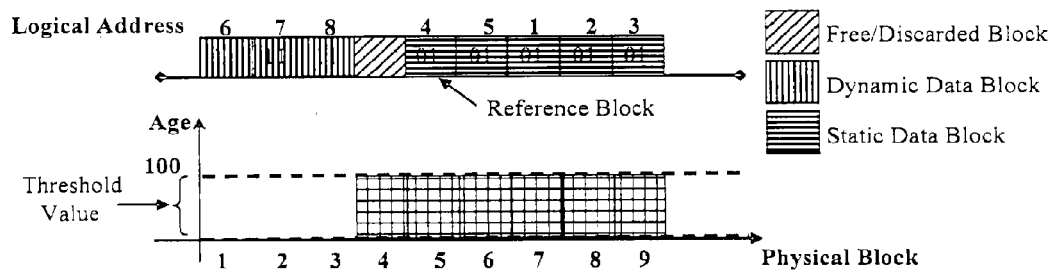

Advantageously, a young dynamic block is not used as a reference block, as indicated in FIG. 9. In fact, if the second wear leveling bit of the dynamic logical block associated with the young physical blocks (logical blocks 6, 7, and 8) is changed, these blocks are excluded from the search for the reference block. In this way, in a transition phase, a dynamic data block can still be selected as a reference block, but this block (logical block 4, for example) is an old block that will not trigger a wear leveling operation.

Figure 10:
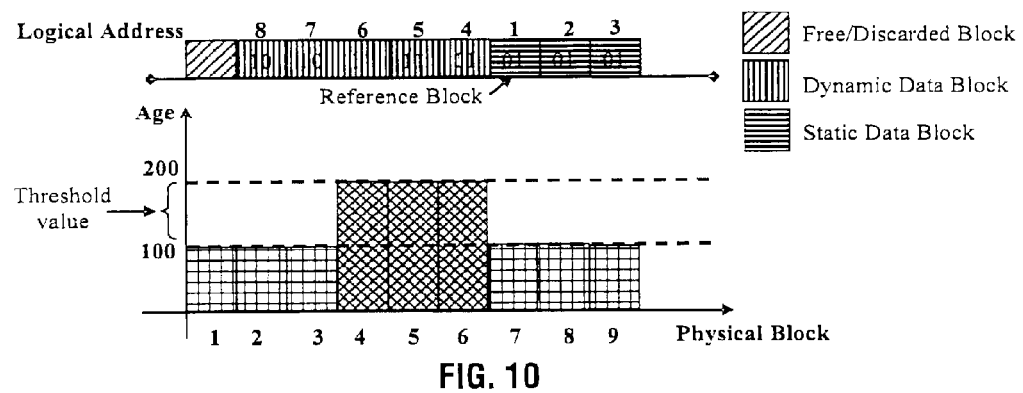
Figure 11:
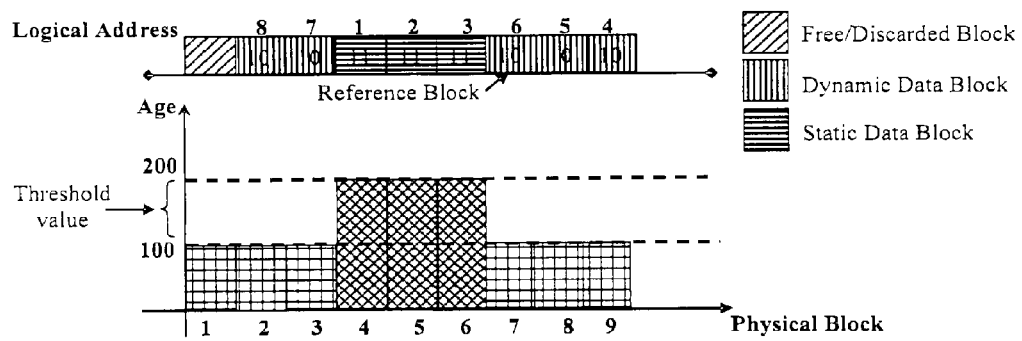

During the second wear leveling cycle, if the host continues to update data at logical addresses 4-8, the second wear leveling bit of all the dynamic/updated logical blocks is changed, as indicated in FIG. 10. The reference block is, again, selected and the static data block set (for example, logical block 1). Again, when there will be an age difference higher than the threshold value, other wear leveling operations are performed, as indicated in FIG. 11.

Figure 12:
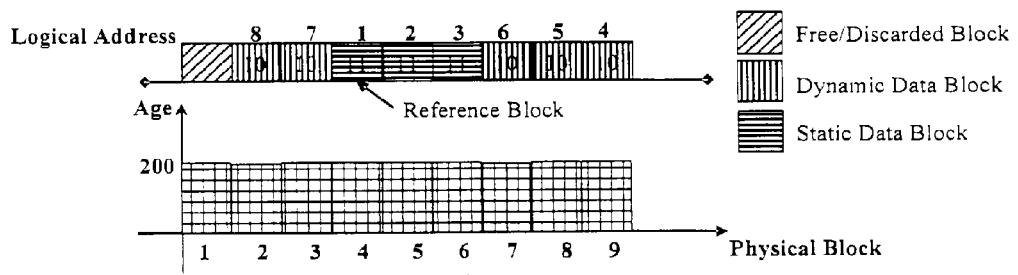
Figure 13:
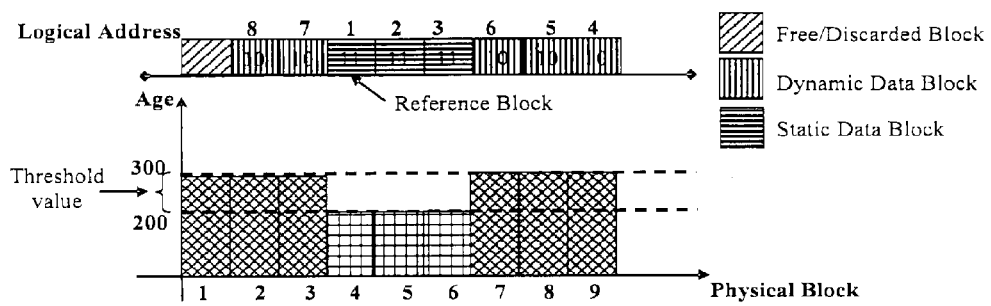

The ages of the physical block tend to be equal during this wear level cycle illustrated in FIG. 12. If the host behavior does not change, after this leveling condition, the age difference is again increased so all previous phases are repeated, as indicated in FIG. 13.

At the end of the first wear leveling cycle, the first wear leveling bit is changed from 0 to 1 for all logical blocks. Subsequently, a new wear leveling cycle starts, to set the second wear leveling bit. During the next two cycles, the wear leveling bits will be changed to 0. Then the first wear leveling bit goes to 1 again and so on. Therefore, a sequence of 0 to 1 and 1 to 0 cycles may be identified for each wear leveling bit. The change of convention (0 to 1 or 1 to 0) in different cycles may be useful to update information related to blocks that are not de-fragmented. In fact, when a logical block is associated to a young physical block, its second bit is changed in order to avoid unneeded wear leveling operations. So, in the next cycle, this block is not involved in wear leveling operations because it should be updated by the host.

If the host changes its behavior and does not update that block, it will not be de-fragmented in a cycle, but in the following cycle it will be de-fragmented because it will not have its bit changed. So the change in the wear leveling bit convention allows the algorithm to adapt to a change of host behavior in some embodiments.

With a cycle based wear leveling algorithm, all valid data is periodically copied from a physical block to another physical block, even if the data is read only data. However, the wear leveling operations are not enough to solve the read disturb problem. In fact, the duration of a wear leveling cycle depends on host behavior. During a cycle, the host could read a logical address too many times. So, both dynamic and static addresses can be affected by read disturb, requiring a block remap with data contained in it copied in a new physical block. When the anti-read disturb engine copies an overread static address to a free physical block 94, shown in FIG. 2, in order to refresh data, the wear leveling bit is changed as if it was a host operation.

The read disturb problem gets worse when the physical block age increases. So, a set of young physical blocks, called an anti-disturb pool, can be reserved in order to better manage the remap operations. The anti-disturb pool may contain the youngest blocks used to remap static addresses often read by the host.

Figure 14:
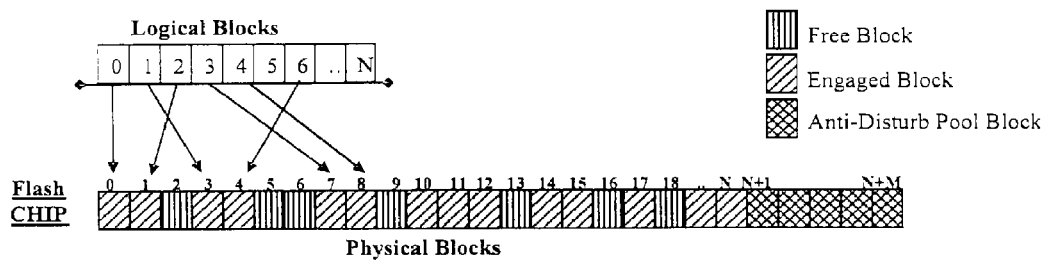
Figure 15:
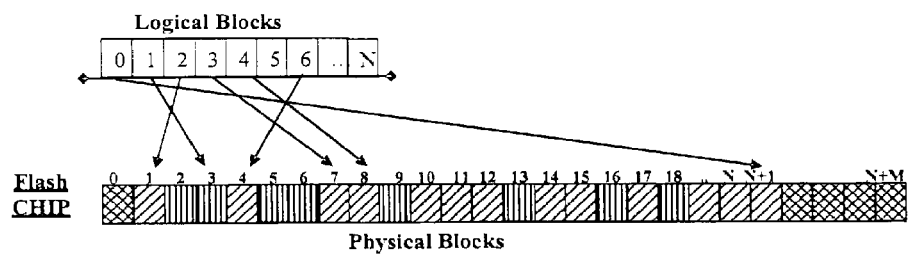

When an anti-read disturb remap operation is required, as indicated in FIG. 14, the overread address is copied to a block belonging to the anti-disturb pool, as indicated in FIG. 15. The used block will be replaced by another young block.

Figure 16:
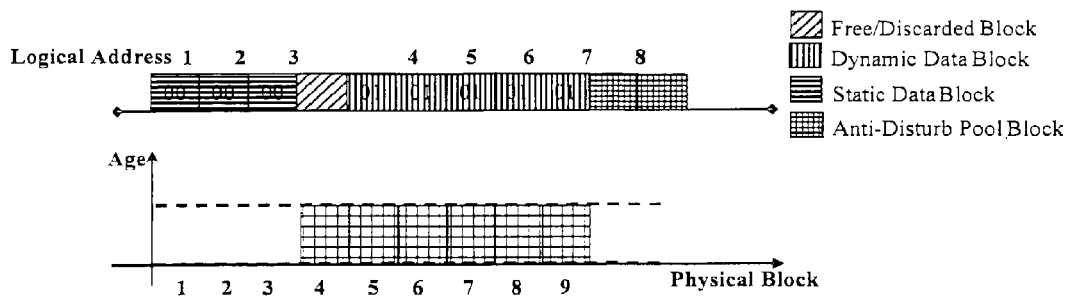
Figure 17:
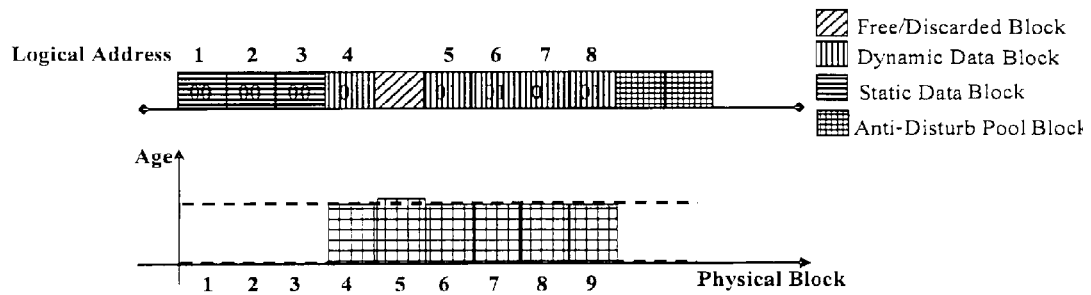

The wear leveling bit can be used to manage the read disturb problem in a different way for static and dynamic blocks. When a dynamic block is affected by a read disturb, as indicated in FIG. 16, it will be remapped on a free block, as indicated in FIG. 17.

Figure 18:
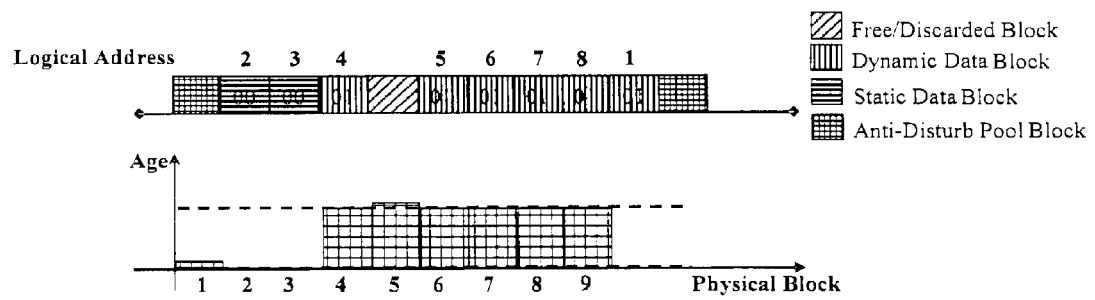

When the block affected by the read is a static block, it can be remapped on a block belonging to an anti-disturb pool, as indicated in FIG. 18. The just discarded block is added to the anti-disturb pool/to replace the used one. As this discarded block could be an old, block, its age is compared with the age of a reference block and of the blocks discarded during the following de-fragmentation. When a younger block is found, it replaces a block of the anti-disturb pool. In this way, the anti-disturb pool is dynamically updated in order to insert in it the youngest blocks of the device.

In some embodiments, the wear leveling algorithm may be less expensive that traditional wear leveling methods. It provides an old block in a relatively easy way, comparing the age of the just dismissed block with a reference, in some embodiments. The use of wear leveling cycles and wear leveling bits may simplify the quest for a candidate for a wear leveling operation and may avoid unnecessary pejorative wear leveling operations in some embodiments. All the information used herein, including wear leveling bits, physical age, reference age, and the like, can easily be stored in NAND, NOR, or phase change memories. However, embodiments may also be implemented using either NOR or phase change memory as they allow smaller data updates.

Figure 19A:
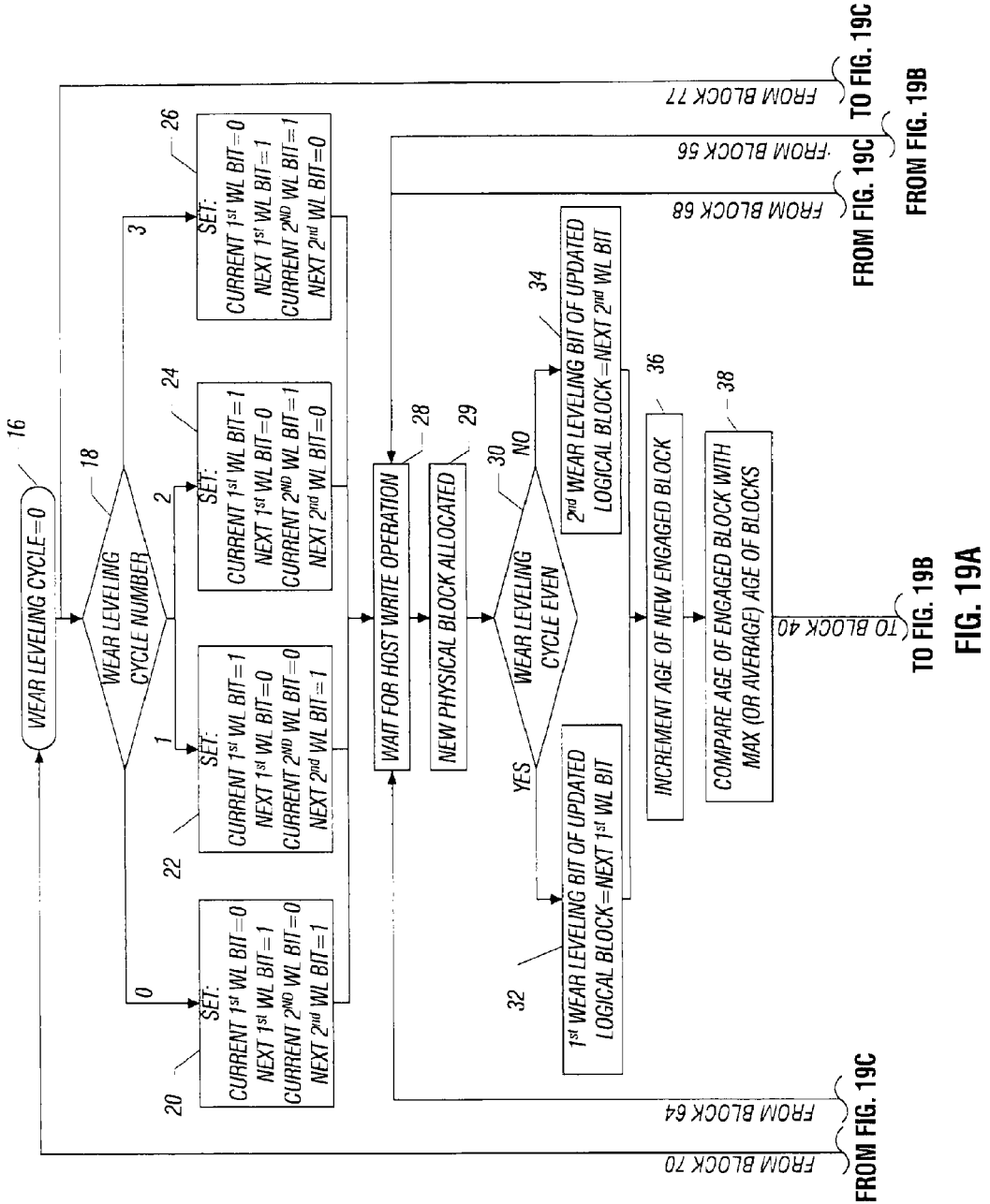
FIGS. 19(A-C) is a flow chart for one embodiment of the present invention.

Referring to FIG. 19A, initially, a wear leveling cycle 0, indicated in block 16, begins. The wear leveling cycle number for each flow iteration is determined in diamond 18. If it is 0, the flow goes to block 20, if it is 1, the flow goes to block 22, if it is 2, the flow goes to block 24, and if it is 3, the flow goes to block 26. In each block 20, 22, 24, and 26, the first and second wear leveling bits are set as indicated in accordance with one embodiment. Then, the flow waits for a host write operation, as indicated in block 28.

After allocating a new physical block (block 29), when the host write operation occurs, a check at diamond 30 determines whether the wear leveling cycle is even. If so, the first wear leveling bit of an updated logical block is set equal to the next first wear level bit. If the wear leveling cycle is not even, the second wear leveling bit of updated logical block is set equal to the second wear level bit.

Then the age of the newly engaged block is incremented, as indicated in block 36, and the age of the engaged block is compared with a maximum age of all the blocks or, an average age of blocks, as indicated in block 38.

Figure 19B:
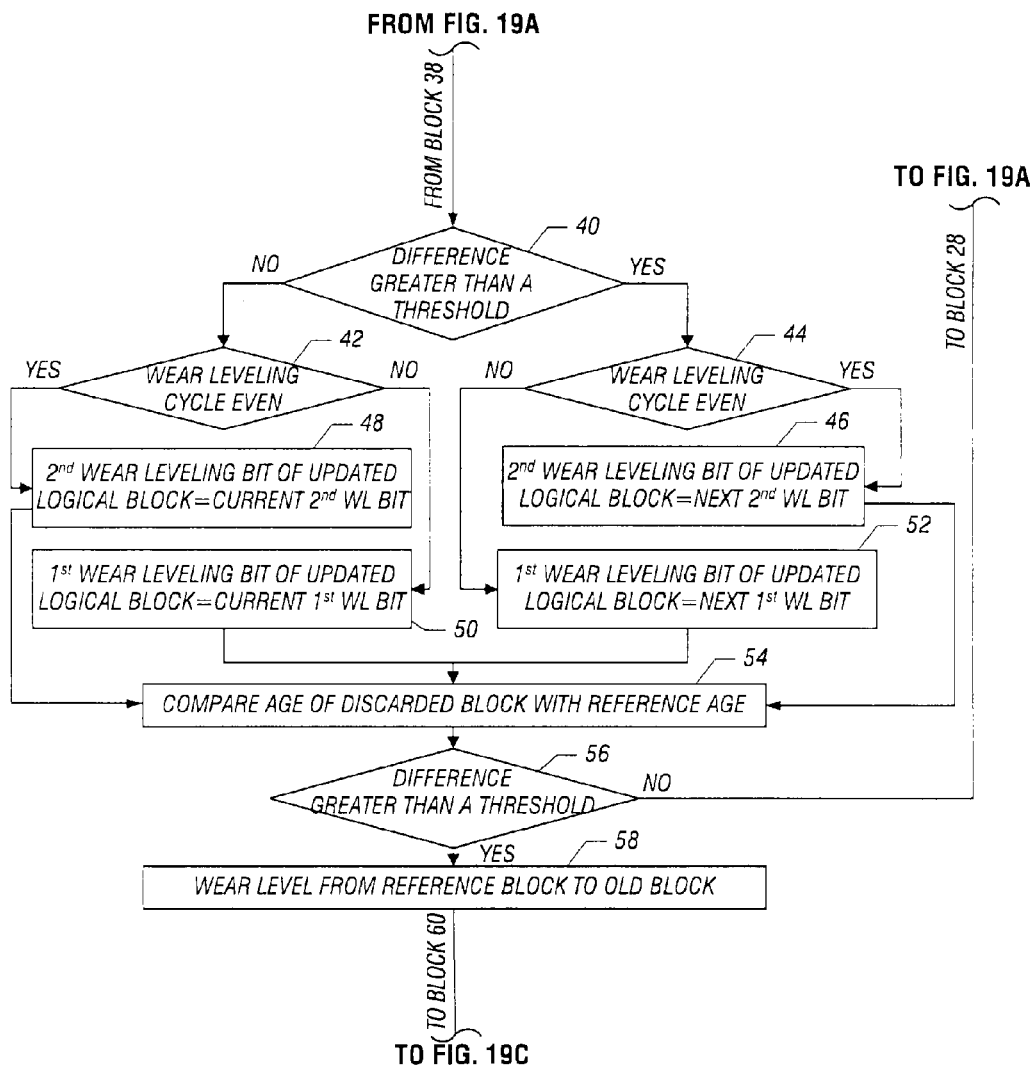

Moving to FIG. 19B, a check at diamond 40 determines whether the age difference is greater than a threshold. If so, a check at diamond 44 determines whether the wear leveling cycle is even. If it is, the second wear leveling bit of the updated logical block is set equal to the next second wear level bit, as indicated in block 46. If not, the first wear leveling bit of the updated logical block is set equal to the first wear level bit, as indicated at block 52.

If the age difference is not greater than the threshold, a check at diamond 42 determines whether the wear leveling cycle is even. If so, the second wear leveling bit of the updated block is set equal to the current second wear leveling bit in block 48. Otherwise, the first wear leveling bit of the updated logical block is set to the current first wear leveling bit in block 50.

Then, whether the difference is greater than a threshold or not, the age of the discarded block is compared with the reference age in block 54. If the difference is greater than a threshold, as determined in diamond 56, wear leveling is done from a reference block to an old, discarded block, as indicated in block 58. Otherwise, the flow returns back to block 28.

Figure 19C:
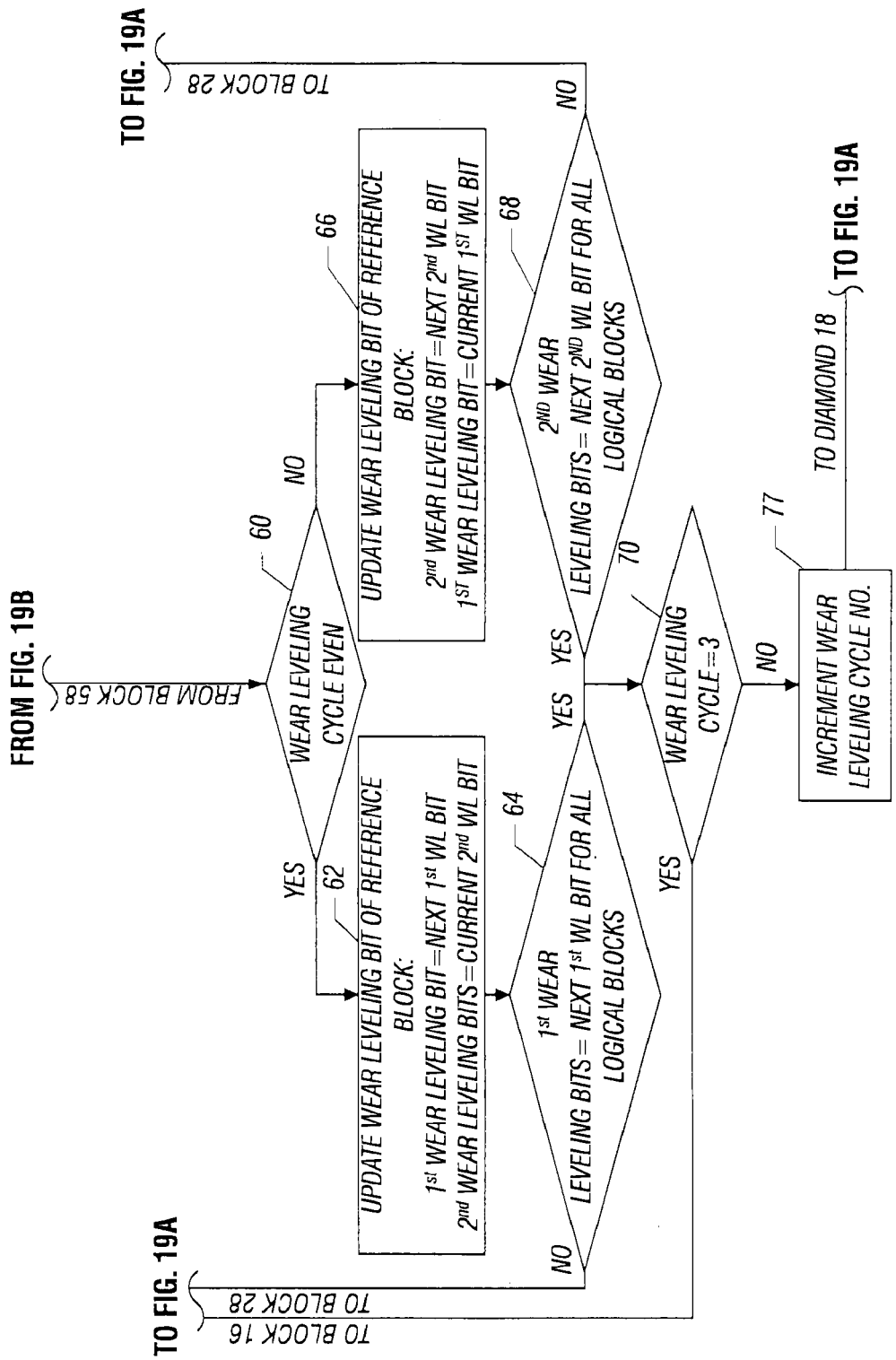

Moving to FIG. 19C, a check at diamond 60 determines whether the wear leveling cycle is even. If so, the wear leveling bit of the reference block is updated in the following way. The first wear leveling bit is set equal to the next first wear level bit and the second wear leveling bit is set equal to the current second wear level bit, as indicated in block 62. If the wear leveling cycle is not even, as determined in diamond 60, the wear leveling bit of the reference block is updated such that the second wear leveling bit is set equal to the next second wear leveling bit and the first wear leveling bit is set equal to the current first wear leveling bit in block 66.

The flow proceeds from block 62 to diamond 64. There, a check determines whether the first wear leveling bits have been set equal to the first wear leveling bits for all logical blocks. If not, the flow iterates back to block 28. Otherwise, it moves to diamond 70.

For the situation where the wear leveling cycle is not even, a check at diamond 68 determines whether the second wear leveling bits are equal to the second wear leveling bits for all logical blocks at diamond 68. If so, the flow goes to diamond 70 and, otherwise, it goes back to block 28.

At diamond 70, a check determines whether the wear leveling cycle is equal to 3. If so, the flow iterates back to block 16 and, otherwise, the wear leveling cycle is incremented, as indicated in block 77, and the flow goes back to diamond 18 in FIG. 19A.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

The invention claimed is:

1. A method, comprising:
   performing wear leveling when a difference of ages of a discarded block and a reference block exceeds a threshold; and
   selecting a new reference block from engaged blocks having respective wear level bits that did not change in a previous wear leveling.

2. The method of claim 1, further comprising:
   starting a new wear leveling cycle when all of the wear level bits have been changed.

3. The method of claim 1, further comprising:
   updating a first wear level bit of the wear level bits based on the wear leveling being even; and
   updating a second wear level bit of the wear level bits based on the wear leveling being odd.

4. The method of claim 3, wherein the first wear level bit and the second wear level bit are associated with a logical block.

5. The method of claim 4, wherein the first or second wear level bit is changed as a result of a garbage collection operation to said logical block.

6. The method of claim 1 wherein performing wear leveling comprises moving data from the reference block to the discarded block.

7. A method, comprising:
   determining an age difference based on an age of a new engaged block and an age of at least one other block, wherein the new engaged block and the at least one other block are included in a plurality of blocks, wherein the wear level bits of the at least one other block are unchanged from a previous wear leveling; and performing wear leveling when the age difference exceeds a threshold.

8. The method of claim 7 wherein the age of the at least one other block comprises an age of a maximum age block included the plurality of blocks.

9. The method of claim 7 wherein the age of the at least one other block comprises an average age of the plurality of blocks.

10. The method of claim 7 further comprising changing the wear level bits associated with the plurality of blocks involved in the wear leveling.

11. The method of claim 10, wherein each of the plurality of blocks is associated with a first wear leveling bit and a second wear leveling bit.

12. The method of claim 11 further comprising using the second wear leveling bit to prevent the new engaged block from being involved in the wear leveling if the new engaged block is below a certain age.

13. The method of claim 7 further comprising storing information about ages of the plurality of blocks.

14. The method of claim 13 further comprising moving data in an overread static block to a block belonging to an anti-disturb pool, wherein the anti-disturb pool includes young blocks, based on the information about the ages of the plurality of blocks.

15. The method of claim 13 wherein the wear leveling comprises remapping data from young blocks to older blocks included in the plurality of blocks, wherein the young blocks and older blocks are determined based on the information about ages of the plurality of blocks.

16. The method of claim 7 further comprising moving data in an overread dynamic block to a free block included in the plurality of blocks.

17. An apparatus comprising:

a first storage configured to store information about ages of a plurality of physical memory blocks;

a second storage configured to store wear level bits, wherein two wear level bits are associated with each of the plurality of physical memory blocks; and a wear level engine configured to move data from a first physical memory block of the plurality of physical memory blocks to a second physical memory block of the plurality of physical memory blocks based, at least in part, on a difference in the ages of the first physical memory block and the second physical memory block, and wherein the wear level engine is further configured to change one of the two wear level bits in alternating wear leveling cycles.

18. The apparatus of claim 17, wherein at least one of the two wear level bits associated with the first physical memory block is configured to be changed when the wear level engine moves data from the first physical memory block.

19. The apparatus of claim 17, wherein the wear level engine is further configured to change at least one of the two wear level bits associated with each of the plurality of physical memory blocks as a result of a write operation.

20. The apparatus of claim 17, wherein the wear level engine is further configured to perform wear leveling when the difference in ages between two of the plurality of physical memory blocks exceeds a threshold.

21. The apparatus of claim 17 further comprising an anti-read disturb engine configured to move overread static physical memory blocks to physical memory blocks belonging to an anti-disturb pool, and to move overread dynamic physical memory blocks to free physical blocks in the plurality of physical memory blocks.

22. The apparatus of claim 21 wherein the physical memory blocks belonging to the anti-disturb pool are young blocks based on the ages of the plurality of physical memory blocks.

23. The apparatus of claim 17 wherein the apparatus is a memory controller coupled to a flash memory and a host.

* * * * *